(12) United States Patent
Sakashita et al.

(10) Patent No.: US 7,145,198 B2
(45) Date of Patent: Dec. 5, 2006

(54) COMPOSITIONS FOR THIN-FILM CAPACITANCE DEVICE, HIGH-DIELECTRIC CONSTANT INSULATING FILM, THIN-FILM CAPACITANCE DEVICE, AND THIN-FILM MULTILAYER CAPACITOR

(75) Inventors: Yukio Sakashita, Chiba (JP); Hiroshi Funakubo, Kanagawa (JP)

(73) Assignee: TDK Corporation, Tokyo (JP)

( * ) Notice: Subject to any disclaimer, the term of this patent is extended or adjusted under 35 U.S.C. 154(b) by 187 days.

(21) Appl. No.: 10/487,782

(22) PCT Filed: Aug. 26, 2002

(86) PCT No.: PCT/JP02/08573

§ 371 (c)(1),
(2), (4) Date: Feb. 26, 2004

(87) PCT Pub. No.: WO03/021615

PCT Pub. Date: Mar. 13, 2003

(65) Prior Publication Data

US 2004/0217445 A1 Nov. 4, 2004

(30) Foreign Application Priority Data

Aug. 28, 2001 (JP) .............................. 2001-257481
Mar. 1, 2002 (JP) .............................. 2002-055734

(51) Int. Cl.
*H01L 27/108* (2006.01)

(52) U.S. Cl. ................. 257/310; 257/295; 257/E29.343

(58) Field of Classification Search ................ 257/307, 257/310, 534, 295, E29.343; 438/240
See application file for complete search history.

(56) References Cited

U.S. PATENT DOCUMENTS 5,821,005 A 10/1998 Kijima et al.

(Continued)

FOREIGN PATENT DOCUMENTS

JP A 56-144523 11/1981

(Continued)

OTHER PUBLICATIONS

Kojima et al., Mat. Res. Soc. Symp. Proc., col. 748, Materials Research Society, pp. 451-456, 2003.

(Continued)

*Primary Examiner*—Kenneth Parker
*Assistant Examiner*—Matthew E. Warren
(74) *Attorney, Agent, or Firm*—Oliff & Berridge, PLC

(57) ABSTRACT

A thin-film capacitor(2) in which a lower electrode(6), a dielectric thin-film(8), and an upper electrode(10) are formed in order on a substrate(4). The dielectric thin-film(8) is made of a composition for thin-film capacitance devices. The composition includes a bismuth layer-structured compound whose c-axis is oriented vertically to the substrate surface and which is expressed by a formula: $(Bi_2O_2)^{2+}(A_{m-1}B_mO_{3m+1})^{2-}$, or $Bi_2A_{m-1}B_mO_{3m+3}$ wherein "m" is an odd number, "A" is at least one element selected from Na, K, Pb, Ba, Sr, Ca and Bi, and "B" is at least one element selected from Fe, Co, Cr, Ga, Ti, Nb, Ta Sb, V, Mo and W. Even if the dielectric thin-film is made more thinner, the dielectric constant is relatively high, and the loss is small. The leak characteristics are excellent, the temperature characteristics of the dielectric constant are excellent, the break-down voltage is improved and the surface smoothness is excellent.

33 Claims, 4 Drawing Sheets

U.S. PATENT DOCUMENTS

| | | | |
|---|---|---|---|
| 5,828,080 | A | 10/1998 | Yano et al. |
| 5,955,213 | A | 9/1999 | Yano et al. |
| 5,985,404 | A | 11/1999 | Yano et al. |
| 6,093,338 | A | 7/2000 | Tani et al. |
| 6,106,616 | A | 8/2000 | Machida et al. |
| 6,121,647 | A * | 9/2000 | Yano et al. ................. 257/295 |
| 6,198,119 | B1 * | 3/2001 | Nabatame et al. .......... 257/295 |
| 6,537,830 | B1 * | 3/2003 | Arita et al. ..................... 438/3 |
| 6,610,549 | B1 * | 8/2003 | Aggarwal et al. ............. 438/3 |

FOREIGN PATENT DOCUMENTS

| | | |
|---|---|---|
| JP | A 5-335173 | 12/1993 |
| JP | A 5-335174 | 12/1993 |
| JP | A-8-253324 | 10/1996 |
| JP | A-09-110592 | 4/1997 |
| JP | A-10-194894 | 7/1998 |
| JP | A 10-298739 | 11/1998 |
| JP | A-10-338599 | 12/1998 |
| JP | A 11-214245 | 8/1999 |
| JP | A 2000-124056 | 4/2000 |
| JP | 2001144263 A * | 5/2001 |
| JP | A 2001-144263 | 5/2001 |

OTHER PUBLICATIONS

Kojima et al., The 27th Annual Cocoa Beach Conference & Exposition on Advanced Ceramics & Composites, Jan. 26-31, 2003.

The 5th International Meeting of Pacific Rim Ceramic Societies Incorporating the 16th Fall Meeting of the Ceramic Society of Japan, pp. 35, 2003.

The 5th International Meeting of Pacific Rim Ceramic Societies Incorporating the 16th Fall Meeting of the Ceramic Society of Japan, pp. 111, 2003.

MRS 2002, Program Exhibit Guide, Dec. 2-6, pp. 211, 2002.

Nakaiso et al., Extended Abstracts (The 50th Spring Meeting), The Japan Society of Applied Physics and Related Societies, pp. 596, 2003.

Oikawa et al., Extended Abstracts (The 64th Autumn Meeting), The Japan Soceity of Applied Physics, pp. 493, 2003.

* cited by examiner

US 7,145,198 B2

COMPOSITIONS FOR THIN-FILM CAPACITANCE DEVICE, HIGH-DIELECTRIC CONSTANT INSULATING FILM, THIN-FILM CAPACITANCE DEVICE, AND THIN-FILM MULTILAYER CAPACITOR

FIELD OF THE INVENTION

The present invention relates to compositions for thin-film capacitance device, high-dielectric constant insulating film, thin-film capacitance device, and thin-film multilayer capacitor. More particularly, the invention relates to compositions for thin-film capacitance device used as dielectric thin-films or so for thin-film capacitance device of every kind, such as condenser or capacitor having conductor-insulator -conductor structure and thin-film capacitance device such as condenser or capacitor wherein said compositions for thin-film capacitance device is used as dielectric thin-film.

DESCRIPTION OF THE RELATED ART

In recent years, in the field of Electronic Component, along with the tendencies of higher density and higher integration of electronic circuit, circuit devices essential to electronic circuit of every kind, such as capacitance device, are desired for more compact body and higher performance.

For instance, thin-film capacitor using a layer dielectric thin-film, in respect of integrated circuit with active component such as transistor, is delayed for more compact body. This is a factor of obstruction for realizing ultrahigh integrated circuit. More compact body for thin-film capacitor is delayed because dielectric constant of dielectric materials used for the thin-film capacitor was low. Accordingly, in order to realize more compact body and relatively high capacitance, the use of dielectric materials with high dielectric constant is important.

Moreover, in recent years, from the point of capacity density, conventional $SiO_2$ and $Si_3N_4$ multilayer films are not good enough to be used for capacitor materials of advanced DRAM(gigabit generation), and materials with more higher dielectric constant are being noticed. In these materials, the application of $TaOx(\epsilon=\sim 30)$ has been mainly concerned, but other materials have actively come into develop.

On the other hand, as dielectric materials having relatively high dielectric constant, $(Ba, Sr)TiO_3$(BST) or $Pb(Mg_{1/3}Nb_{2/3})O_3$(PMN) are known.

Therefore, composing thin-film capacitance device by the use of these kinds of dielectric materials, more compact body may be expected.

However, when these kinds of dielectric materials are used, by making the dielectric film thinner, dielectric constant lowered in some cases. And due to pores that appear on dielectric film by making the dielectric film thinner, leak characteristic and break-down voltage deteriorated in some cases. Further, formed dielectric film deteriorated in surface smoothing property and change rates of dielectric constant to temperature also tends to deteriorate in some cases. Further, in recent years, since lead compound such as PMN have large influence on environment, high-storage capacitor without lead is desired.

To the contrary, in order to realize more compact body and higher storage of multilayer ceramic capacitor, the thickness of each layer for dielectric layer is desired to be further thinner as much as possible(further thinner layer) and the number of laminated layers for dielectric layer at a fixed size is desired to improve as much as possible(multiple layers).

However, by the use of sheet method(A method comprising the following steps. Dielectric green sheet layer is formed such as by doctor blade method on carrier film using dielectric layer paste. And on the dielectric green sheet layer, internal electrode paste is printed by fixed pattern. Afterwards, these are peeled off and laminated by each layer.), when producing multilayer ceramic capacitor, it is impossible to form thinner dielectric layer than ceramic source material powder. Besides, short or breaking internal electrode problems due to dielectric layer defects, the dielectric layer was difficult to be further thinner, for instance, 2 μm or less. Moreover, when dielectric layer of each layer is further thinner, the number of laminated layers had its limit. Further, by the use of printing method(A method, using screen printing method or so, which plural number of dielectric layer paste and internal electrode paste are alternately printed on carrier film and then the carrier film is peeled off.), when producing multilayer ceramic capacitor, the same problem exists.

Due to these causes, producing more compact body and relatively high capacitance of multilayer ceramic capacitor had its limit.

Accordingly, in order to overcome these problems, various proposes are done(ex. Japanese Unexamined Patent Publications No. 56-144523, No. 5-335173, No. 5-335174, No. 11-214245 and No. 2000-124056).

These publications disclose methods to produce multilayer ceramic capacitor which dielectric thin-films and electrode thin-films are alternately laminated using thin-film forming method of every kind such as CVD method, evaporation method or sputtering method.

However, dielectric thin-film formed by the methods described in these publications have bad surface smoothing property and when too many of the dielectric thin-film are layered, electrode may short-circuit in some cases. Accordingly, the number of laminated layers of at most 12 to 13 or so can only be produced, so that even capacitor was capable of realizing more compact body, it was not capable of higher capacitance.

Further, as shown in an reference "Particle orientation for bismuth layer-structured ferroelectric ceramic and application to its piezoelectric and pyroelectric materials" by Tadashi Takenaka, doctoral dissertation of engineering at Kyoto University(1984), pages 23 to 77 of Article 3, it is known that following composition composes a bulk bismuth layer-structured compound dielectric obtained by sintering method; a composition expressed by formula: $(Bi^2O_2)^{2+}$ $(A_{m-1}B_mO_{3m+1})^{2-}$ or $Bi_2 A_{m-1}B_mO_{3m+3}$ wherein symbol m is selected from positive numbers of 1 to 8, symbol A is at least one element selected from Na, K, Pb, Ba, Sr, Ca and Bi and B is at least one element selected from Fe, Co, Cr, Ga, Ti, Nb, Ta Sb, V, Mo and W.

However, this article did not describe under which condition(ex. the relation between substrate surface and degree of c-axis orientation) the compositions shown by abovementioned formula are made further thinner(ex. 1 μm or less) in order to obtain the following thin-film. A thin-film which is, when made further thinner, capable of providing relatively high dielectric constant and low loss, and also superior leak property, break-down voltage, temperature characteristic of dielectric constant and surface smoothness property.

DISCLOSURE OF THE INVENTION

The object of the invention is to provide compositions for thin-film capacitance device that are, even made further thinner, capable of providing relatively high dielectric constant and low-loss, and also superior leak property, break-down voltage, temperature characteristic of dielectric constant and surface smoothness property, and to provide thin-film capacitance device using the compositions. Also, another object of the present invention is, by using these thin-film capacitance device compositions as dielectric thin-film, to provide a thin-film multilayer capacitor which can give more compact body and relatively high capacitance. Further, the present invention is also to provide high-dielectric constant insulating film which provide, even made further thinner, relatively high dielectric constant and low-loss, also superior leak property, break-down voltage, temperature characteristic of dielectric constant and surface smoothness property.

The inventors of the present invention have earnestly considered of dielectric thin-film materials used for capacitor and its crystal structure. As a result, using a bismuth layer-structured compound having specific composition, moreover, by orientating c-axis([001] orientation) of the bismuth layer-structured compound vertically to substrate surface and composing dielectric thin-film as thin-film capacitance device compositions, that is, by forming c-axis orientation film(thin-film normal is parallel to c-axis) of bismuth layer-structured compound on to the substrate surface, it was found that thin-film capacitance device compositions and thin-film capacitance device using the compositions could be provided. The thin-film capacitance device compositions are, even made further thinner, relatively high dielectric constant and low-loss(low tan δ) can be provided, and also superior leak property, break-down voltage, temperature characteristic of dielectric constant and surface smoothness property. Moreover, by the use of these thin-film capacitance device compositions as dielectric thin-film, it was found that number of laminated layers can be increased and thin-film multilayer capacitor which can give more compact body and relatively high capacitance can be provided. This brought completion of the present invention. Furthermore, by using these compositions as high dielectric constant insulating film, it was found that the compositions can be applied other than as thin-film capacitance device, which brought completion of the present invention.

Therefore, thin-film capacitance device compositions according to the present invention including a bismuth layer-structured compound whose c-axis is oriented vertically to a substrate surface wherein said bismuth layer-structured compound is expressed by a formula: $(Bi_2O_2)^{2+}(A_{m-1}B_mO_{3m+1})^{2-}$ or $Bi_2A_{m-1}B_mO_{3m+3}$ in which symbol "m" is selected from odd numbers, symbol "A" is at least one element selected from Na, K, Pb, Ba, Sr, Ca and Bi and symbol "B" is at least one element selected from Fe, Co, Cr, Ga, Ti, Nb, Ta Sb, V, Mo and W.

"Thin-film" according to the invention is a film for materials whose thickness is about several Å to several μm and formed by thin-film forming method of every kind. "Thin-film" excludes a thick-film bulk whose thickness is about several hundreds μm or more and formed by sintering method. Thin-film includes continuous film which covers fixed area continuously and also intermittent film which covers optional intervals intermittently. Thin-film may be formed at a part of substrate surface and may also be formed at the entire surface.

The thickness of dielectric thin-film(or high dielectric constant insulating film) formed by thin-film capacitance device compositions according to the invention is preferably 5 to 1000 nm. When at this thickness, the present invention is quite effective.

The process of manufacturing thin-film capacitance device compositions according to the invention is not particularly limited but it can be manufactured by, for instance, using substrates of cubic system, tetragonal system, orthorhombic system, or monoclinic system that are [100] oriented, and forming thin-film capacitance device compositions including a bismuth layer-structured compound which is expressed by a formula: $(Bi_2O_2)^{2+}(A_{m-1}B_mO_{3m+1})^{2-}$ or $Bi_2A_{m-1}B_mO_{3m+3}$ wherein symbol "m" is selected from odd numbers, symbol "A" is at least one element selected from Na, K, Pb, Ba, Sr, Ca and Bi and symbol "B" is at least one element selected from Fe, Co, Cr, Ga, Ti, Nb, Ta Sb, V, Mo and W. In this case, the abovementioned substrate is preferably composed by single crystal.

Thin-film capacitance device of the invention is characterized in a thin-film capacitance device wherein lower electrode, dielectric thin-film and upper electrode are formed one by one on the substrate and said dielectric thin-film is composed of abovementioned thin-film capacitance device compositions of the invention.

Thin-film multilayer capacitor of the invention comprising dielectric thin-films and internal electrode thin-films alternately layered on a substrate, wherein said dielectric thin-films are composed of abovementioned thin-film capacitance device compositions of the invention.

According to the present invention, a bismuth layer-structured compound whose c-axis is oriented 100% vertically to the substrate surface, that is, a bismuth layer-structured compound whose degree of c-axis orientation is 100%, which is particularly preferable. However, the degree of c-axis orientation may not be complete 100%.

Preferably, said bismuth layer-structured compound whose degree of c-axis orientation is 80% or more, more preferably, 90% or more, most preferably, 95% or more. By improving the degree of c-axis orientation, the effect of the present invention improves.

Preferably, "m" in the formula composing said bismuth layer-structured compound is 1, 3, 5 or 7, more preferably, 1, 3 or 5. This is due to the easiness of manufacturing.

Preferably, said thin-film capacitance device compositions further include rare-earth element(at least one element selected from Sc, Y, La, Ce, Pr, Nd, Pm, Sm, Eu, Gd, Tb, Dy, Ho, Er, Tm, Yb and Lu).

Preferably said rare-earth element is "Re" and when said bismuth layer-structured compound is expressed by formula: $Bi_2A_{m-1-x}Re_xB_mO_{3m+3}$, said x is 0.4 to 1.8, more preferably, 1.0 to 1.4. Including rare-earth element decreases leak current and short ratio, and also Curie temperature can be −100° C. or more to 100° C. or less.

Preferably, said thin-film capacitance device compositions have Curie temperature of −100° C. or more to 100° C. or less.

Preferably, thin-film multilayer capacitor of the invention, said internal electrode thin-film is composed of noble metal, base metal or conductive oxide.

At the thin-film capacitance device and thin-film multilayer capacitor of the invention, said substrate may be composed of amorphous material. Lower electrode(or internal electrode thin-film) formed on the substrate is preferably [100] oriented. By forming lower electrode to [100] orientation, c-axis of a bismuth layer-structured compound composing dielectric thin-film formed on the lower electrode can orient vertically to the substrate surface.

Thin-film capacitance device compositions of the invention and dielectric thin-film as their example are composed of c-axis oriented bismuth layer-structured compound having specific composition.

Thin-film capacitance device compositions composed of c-axis oriented bismuth layer-structured compound having specific composition are, even when film thickness is made further thinner, relatively high dielectric constant(ex. more than 200) and low loss(tan δ is 0.02 or less) can be provided. They can also provide superior leak property(ex. leak current is $1 \times 10^{-7}$ A/cm$^2$ or less and short ratio is 10% or less when measured at 50 kV/cm electrolytic strength), improved break-down voltage(ex. 1000 kV/cm or more), superior temperature characteristic of dielectric constant(ex. average change rates of dielectric constant to temperature is within ±500 ppm/° C. at reference temperature of 25° C.) and superior surface smoothness property(ex. surface roughness: Ra is 2 nm or less).

Further, thin-film capacitance device compositions according to the present invention are, when its film thickness is made further thinner, relatively high dielectric constant can be provided. Moreover, due to the satisfactory surface smoothness, increasing number of laminated layers for dielectric thin-film as said thin-film capacitance device compositions is capable. Therefore, by using the thin-film capacitance device compositions, thin-film multilayer capacitor that can give more compact body and relatively high capacitance can be provided.

Further, thin-film capacitance device compositions and thin-film capacitance device of the invention are superior in frequency characteristic(ex. At specific temperature, ratio of dielectric constant value at high frequency domain of 1 MHz and those at lower than the above frequency domain of 1 kHz is 0.9 to 1.1 in absolute value.) and also in voltage characteristic (ex. At specific frequency, ratio of dielectric constant value at measuring voltage of 0.1V and those at measuring voltage of 5V is 0.9 to 1.1 in absolute value).

Furthermore, thin-film capacitance device compositions of the invention are superior in temperature characteristic for electrostatic capacity(average change rates of the electrostatic capacity to temperature is within ±500 ppm/° C. at reference temperature of 25° C.).

For thin-film capacitance device, but not particularly limited to, conductor —insulator—conductor structured condenser(ex. single layer typed thin-film capacitor or multilayer typed thin-film multilayer capacitor ) or capacitor(ex. such as for DRAM) are exemplified.

For thin-film capacitance device compositions, but not particularly limited to, dielectric thin-film compositions for condenser or dielectric thin-film compositions for capacitor are exemplified.

High dielectric constant insulating film of the invention is composed of the same compositions as thin-film capacitance device compositions of the invention. High dielectric constant insulating film of the invention can be used as, other than thin-film dielectric film for thin-film capacitance device or capacitor, gate-insulating film of semiconductor device or intermediate insulating film between gate electrode and floating gate or so.

DESCRIPTION OF THE PREFERRED EMBODIMENTS

Below, the present invention will be explained based on embodiments shown in drawings.

First Embodiment

Figure 1:
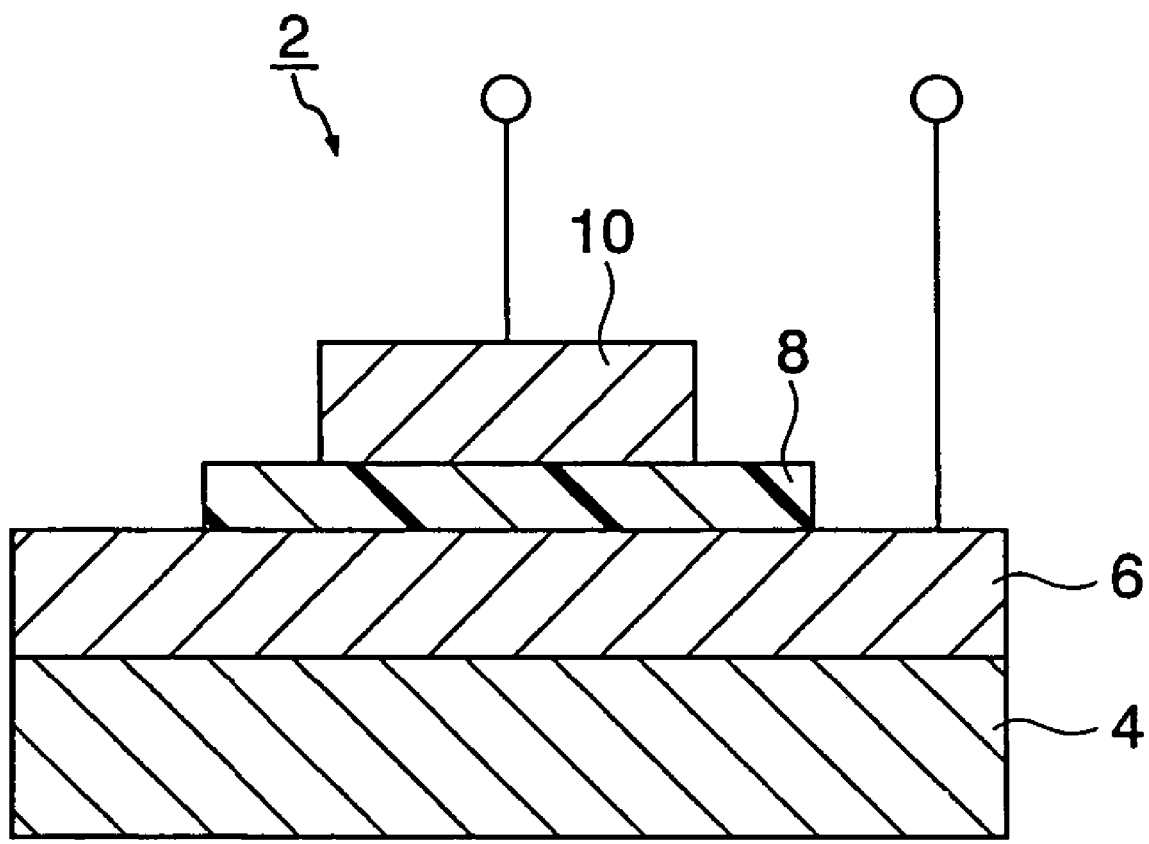
FIG. 1 is a sectional view of an example for thin-film capacitor of the invention.

The present embodiment is described by exemplifying a thin-film capacitor forming a layer dielectric thin-film as thin-film capacitance device. As shown in FIG. 1, thin-film capacitor 2 according to an embodiment of the invention includes substrate 4, and on the substrate 4, lower electrode thin-film 6 is formed. On lower electrode thin-film 6, dielectric thin-film 8 is formed. On dielectric thin-film 8, upper electrode thin-film 10 is formed.

Substrate 4 is composed of single crystal with high matched lattice (ex. single crystal of SrTiO$_3$, MgO or LaAlO$_3$), amorphous materials(ex. glass, fused quartz or SiO$_2$/Si) and other materials(ex ZrO$_2$/Si or CeO$_2$/Si) or so. Particularly, composed of substrate oriented to such as [100] orientation e.g. cubic system, tetragonal system, orthorhombic system, or monoclinic system, are preferable. Thickness of substrate 4 is not particularly limited but is about 100 to 1000 μm.

When using single crystal with high matched lattice as substrate 4, lower electrode thin-film 6 is preferably composed of conductive oxide, such as CaRuO$_3$ or SrRuO$_3$, or noble metal such as Pt or Ru, more preferably, [100] oriented conductive oxide or noble metal. When using substrate 4 which is [100] oriented, conductive oxide or noble metal which is [100] oriented can be formed on its surface. By composing lower electrode thin-film 6 with [100] oriented conductive oxide or noble metal, degree of orientation to [001], that is, degree of c-axis orientation of dielectric thin-film 8 formed on the lower electrode thin-film 6 increases. This lower electrode thin-film 6 is formed by normal thin-film forming method. However, it is preferable to be formed by physical vapor deposition method such as sputtering method or pulsed laser deposition method(PLD) in which temperature of substrate 4 for forming lower electrode thin-film 6 on its surface is preferably 300° C. or more, more preferably 500° C. or more.

Lower electrode thin-film 6 using amorphous materials for substrate 4 can be composed of conductive glass such as ITO. When using single crystal with high matched lattice as substrate 4, [100] oriented lower electrode thin-film 6 can easily be formed on the surface. Due to this, degree of c-axis orientation of dielectric thin-film 8 formed on the lower electrode thin-film 6 tends to increase. However, even using amorphous materials such as glass for substrate 4, it is possible to form improved degree of c-axis orientation of dielectric thin-film 8. In this case, optimization of film formation condition for dielectric thin-film 8 is required.

As other lower electrode thin-film 6, noble metal such as gold(Au), palladium(Pd), Silver(Ag) or their alloys and also base metal such as Nickel(Ni), Copper(Cu) or their alloys can be used.

The thickness of lower electrode thin-film 6 is not limited but preferably 10 to 1000 nm, more preferably 50 to 100 nm or so.

Upper electrode thin-film 10 can be composed of the same material as said lower electrode thin-film 6. And the thickness can also be the same.

Dielectric thin-film 8 is an example of thin-film capacitance device compositions of the invention, and include bismuth layer-structured compound expressed by formula: $(Bi^?O_2)^{2+}(A_{m-1}B_mO_{3m+1})^{2-}$ or $Bi_2 A_{m-1}B_mO_{3m+3}$. Generally, bismuth layer-structured compound shows a laminar structure which upper and lower parts of laminar perovskite layer, which perovskite lattice composed of (m−1) numbers of $ABO_3$ is ranged, are sandwiched by a pair of Bi and O layer. According to the present embodiment, the bismuth layer-structured compound improves its degree of orientation to [001] orientation, that is, degree of c-axis orientation. Namely, c-axis of bismuth layer-structured compound is vertically oriented to substrate 4 to form dielectric thin-film 8.

In the present invention, it is particularly preferable that the degree of c-axis orientation for the bismuth layer-structured compound is 100%, however, the degree of c-axis orientation may not be complete 100%. Preferably 80% or more, more preferably, 90% or more, the most preferably, 95% or more of the bismuth layer-structured compound may be c-axis oriented. For instance, when bismuth layer-structured compound is c-axis oriented using substrate 4 which is composed of amorphous material such as glass, the degree of c-axis orientation of the bismuth layer-structured compound may be preferably 80% or more. Moreover, when bismuth layer-structured compound is c-axis oriented by the use of following thin-film forming method of every kind, the degree of c-axis orientation of the bismuth layer-structured compound may be preferably 90% or more, more preferably, 95% or more.

In here, the degree of c-axis orientation(F) of bismuth layer-structured compound can be found by the formula: $F(\%)=(P'P0)/(1-P0)\times 100$ . . . (formula 1) wherein P0 is X-ray diffraction strength for c-axis of perfectly random oriented polycrystal and P is practical X-ray diffraction strength for c-axis. In formula 1, P is $(\{\Sigma I(001)/\Sigma I(hkl)\})$ showing the ratio of the sum $\Sigma I(001)$ of reflecting strength I(001) from (001) surface to the sum $\Sigma I(hkl)$ of reflecting strength I(hkl) from each crystal surface(hkl) and P0 is the same. However, in formula 1, X-ray diffraction strength P when 100% c-axis oriented is 1. And by formula 1, when perfectly random oriented(P=P0), F=0% and when perfectly oriented to c-axis orientation(P=1), F=100%.

Further, c-axis of the bismuth layer-structured compound signifies an orientation which a pair of $(Bi_2O_2)^{2+}$ layers are connected to, that is, [001] orientation. In this way, as bismuth layer-structured compound is c-axis oriented, dielectric characteristic of dielectric thin-film 8 give its full ability. That is, even making thickness of dielectric thin-film 8 further thinner, such as 100 nm or less, relatively high dielectric constant and low-loss(tan δ is low) can be provided. And it also provides superior leak property, improved break-down voltage, superior temperature characteristic of dielectric constant and superior surface smoothness property. When tan δ decreases, loss Q(1/tan δ) value increases.

In above formula, when symbol "m" is an odd number, it is not particularly limited. When symbol "m" is an odd number, polarization axis to c-axis orientation also exists and in comparison to when "m" is an even number, dielectric constant at Curie point increases. Further, temperature characteristic of dielectric constant, in comparison to when "m" is an even number, tends to deteriorate. However, better characteristic is shown in comparison to those when conventional BST is used. Particularly, by increasing the value of symbol "m", further rise of dielectric constant can be expected.

In above formula, the symbol "A" is composed of at least one element selected from Na, K, Pb, Ba, Sr, Ca and Bi. Further, when the symbol "A" is composed of two or more elements, the ratio of those elements is optional.

In above formula, the symbol "B" is composed of at least one element selected from Fe, Co, Cr, Ga, Ti, Nb, Ta, Sb, V, Mo and W. Further, when the symbol "B" is composed of two or more elements, the ratio of those elements is optional.

Dielectric thin-film 8, to said bismuth layer-structured compound, further include at least one element(rare-earth element: Re) selected from Sc, Y, La, Ce, Pr, Nd, Pm, Sm, Eu, Gd, Tb, Dy, Ho, Er, Tm, Yb and Lu is preferable. Substitution amount by rare-earth element varies by the value of "m", for instance, when "m"=3 in formula: $Bi_2 A_{2-x}Re_xB_3O_{12}$, $0.4 \leq x \leq 1.8$ is preferable, and $1.0 \leq x \leq 1.4$ is more preferable.

Due to substitution of rare-earth element within this range, Curie temperature(temperature of phase transition from ferroelectric to paraelectric) of dielectric thin-film 8 can be kept, preferably, −100° C. or more to 100° C. or less, more preferably −50° C. or more to 50° C. or less. When Curie point is −100° C. to +100° C., dielectric constant of dielectric thin-film 8 increases. Curie temperature can be measured by DSC(differential scanning calorimetry) or so. Further, when Curie point is less than ambient temperature (25° C.), tan δ further decreases and consequently, the loss Q value further increases.

Further, dielectric thin-film 8, even without rare-earth element Re, is superior in leak characteristic as following. However, with substitution of Re, leak characteristic can be further superior.

For instance, in dielectric thin-film 8 without rare-earth element: Re, leak current measured when 50 kV/cm field intensity can be preferably $1\times10^{-7}$ A/cm$^2$ or less, more preferably $5\times10^{-8}$ A/cm$^2$ or less, further, short ratio can be preferably 10% or less, more preferably, 5% or less.

To the contrary, in dielectric thin-film 8 with rare-earth element Re, leak current measured under the same condition can be preferably $5\times10^{-8}$ A/cm$^2$ or less, more preferably $1\times10^{-8}$ A/cm$^2$ or less, further, short ratio can be preferably 5% or less, more preferably, 3% or less.

Dielectric thin-film 8 has preferably film thickness of 200 nm or less and considering higher capacitance, more preferably those of 100 nm or less. Further, the minimum of film thickness, considering insulating character of film, is preferably about 30 nm.

At dielectric thin-film 8, for instance, surface roughness (Ra) based upon JIS-B0601 is preferably 2 nm or less, more preferably 1 nm or less.

At dielectric thin-film 8, dielectric constant at 25° C.(ambient temperature) and 100 kHz(AC20 mV) metering frequency is preferably more than 200, more preferably 250 or more.

At dielectric thin-film 8, tan δ at 25° C. (ambient temperature) and 100 kHz(AC20 mV) metering frequency is preferably 0.02 or less, more preferably 0.01 or less. Further, the loss Q value is preferably 50 or more, more preferably 100 or more.

At dielectric thin-film 8, even when frequency at particular temperature(ex. 25° C.) is changed to high frequency domain, such as about 1 MHz, dielectric constant change (particularly a decline) is small. Concretely, for instance, at specific temperature, ratio of dielectric constant value at high frequency domain of 1 MHz and those at lower than above frequency domain of 1 kHz can be 0.9 to 1.1 in absolute value. Namely, frequency characteristic is satisfactory.

In dielectric thin-film 8, even when metering voltage (impressed voltage) at specific frequency(ex. 10 kHz, 100 kHz or 1 MHz) is changed to about 5V or so, dielectric constant change is small. Concretely, for instance, at specific frequency, ratio of dielectric constant value at metering voltage of 0.1V and those at metering voltage of 5V can be 0.9 to 1.1. Namely, voltage characteristic is satisfactory.

Such dielectric thin-film 8 can be formed by thin-film forming method of every kind such as vacuum evaporation method, high frequency sputtering method, pulsed laser deposition method(PLD), MOCVD(Metal Organic Chemical Vapor Deposition)method or sol-gel method.

In the present embodiment, by the use of such as substrate oriented to specific orientation(such as [100] orientation), dielectric thin-film 8 is formed. In respect to lower the manufacturing cost, using substrate 4 composed of amorphous material is more preferable. Using the dielectric thin-film 8, a bismuth layer-structured compound having specific composition is composed by orientating to c-axis. Dielectric thin-film 8 and thin-film capacitor 2 using the dielectric thin-film 8 are, even film thickness of dielectric thin-film is made thinner, such as 100 nm or less, relatively high dielectric constant and low loss can be provided. They can also provide superior leak property, improved breakdown voltage, superior temperature characteristic of dielectric constant and superior surface smoothness property.

Further, these dielectric thin-film 8 and thin-film capacitor 2 are also superior in frequency characteristic or voltage characteristic.

Second Embodiment

The present embodiment is described by exemplifying, as thin-film capacitance device, a thin-film multilayer capacitor forming multilayer dielectric thin-film.

Figure 2:
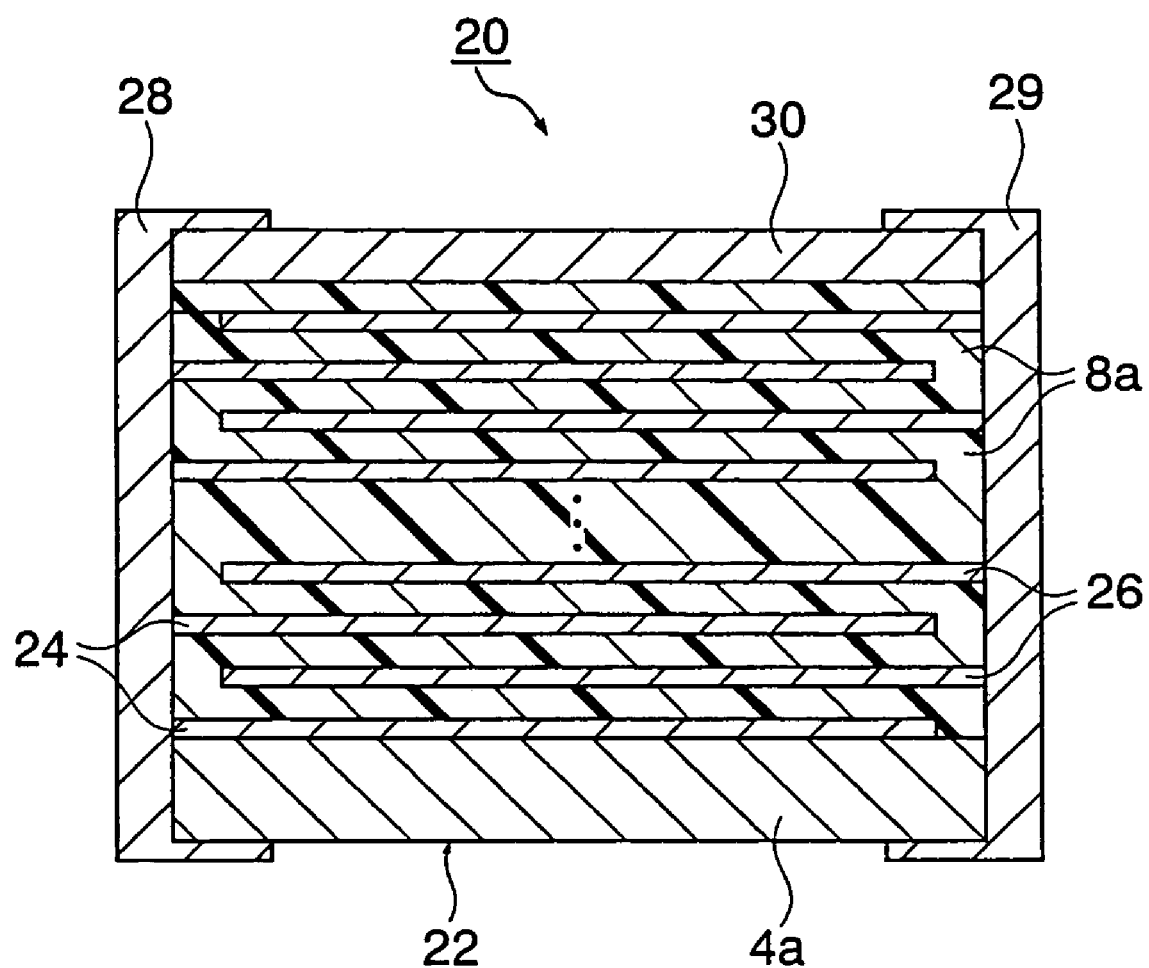
FIG. 2 is a sectional view of an example for thin-film multilayer capacitor of the invention.

As shown in FIG. 2, thin-film multilayer capacitor 20 according to an embodiment of the present invention includes capacitor body 22. The capacitor body 22 has multilayer structure which on the substrate 4a, a multiple number of dielectric thin-film 8a and internal electrode thin-film 24 and 26 are alternately arranged and protection film 30 is formed to cover dielectric thin-film 8a arranged at the most external part. At both ends of the capacitor body 22, a pair of external electrodes 28 and 29 is formed. The pair of external electrodes 28 and 29 is electrically connected to each of the exposed edge faces of a multiple number of internal electrode thin-film 24 and 26 that are alternately arranged inside capacitor body 22 to form capacitor circuit. The shape of capacitor body 22 is not particularly limited but normally, rectangular parallelepiped. Further, its size is not limited but for instance, it has about length of (0.01 to 10 mm)×width of (0.01 to 10 mm)×height of (0.01 to 1 mm).

Substrate 4a is composed of the same material as substrate 4 in abovementioned first embodiment. Dielectric thin-film 8a is composed of the same material as dielectric thin-film 8 in abovementioned first embodiment. Internal electrode thin-films 24 and 26 are composed of the same material as lower electrode thin-film 6 and upper electrode thin-film 10 in abovementioned first embodiment. Material of external electrode 28 and 29 is not limited and the external electrode is composed of conductive oxide such as $CaRuO_3$ or $SrRuO_3$; base metal such as Cu, Cu alloys, Ni or Ni alloys; noble metal such as Pt, Ag, Pd or Ag—Pd alloys. The thickness is not limited but for instance, 10 to 1000 nm or so. Material of protection film 30 is not limited but composed of such as silicon oxide film or aluminum oxide film. Thin-film multilayer capacitor 20 have first layer of internal electrode thin-film 24 formed on substrate 4a by masking with metal mask or so, then, dielectric thin-film 8a formed on the internal electrode thin-film 24 and further, second layer of internal electrode thin-film 26 formed on the dielectric thin-film 8a. After these processes are repeated for multiple times, dielectric thin-film 8a arranged at the most external part and opposite side of the substrate 4a is covered with protection film 30. And on the substrate 4a, a multiple number of internal electrode thin-film 24 and 26 and dielectric thin-film 8a alternately arranged capacitor body 22 is formed. Covering the protection film 30 can decrease the effect of moisture in atmosphere on internal part of capacitor body 22. And when external electrodes 28 and 29 are formed at both ends of the capacitor 22 by dipping or sputtering or so, internal electrode thin-film 24 of odd number layers and one side of external electrode 28 are electrically connected and continuity is maintained. Then, internal electrode thin-film 26 of even number layers and the other side of external electrode 29 are electrically connected and continuity is maintained to obtain thin-film multilayer capacitor 20.

In respect to lower the manufacturing cost, using substrate 4a composed of amorphous material is more preferable.

Dielectric thin-film 8a of the present embodiment is, even when made thinner, relatively high dielectric constant can be provided and moreover, surface smoothness property is satisfactory. Due to these, the number of laminated layers can be 20 or more, preferably 50 or more. Accordingly, thin-film multilayer capacitor 20 which may be small-sized and relatively high capacitance can be provided.

At thin-film capacitor 2 and thin-film multilayer capacitor 20 of the abovementioned present embodiment, when temperature is within temperature range of at least −55° C. to +150° C., average change rates($\Delta\epsilon$) of dielectric constant is preferably within ±500 ppm/° C. (25° C. reference temperature), and more preferably within +250 ppm/° C.

Next, examples wherein the embodiment of the present invention is described more specifically and the present invention will be explained further in detail. Note that the present invention is not limited to the embodiments.

EXAMPLE 1

$CaRuO_3$ as lower electrode thin-film was epitaxial grown to [100] orientation to form $SrTiO_3$ single crystal substrate (($100)CaRuO_3$//($100)SrTiO_3$) and was heated to 850° C. Then, on the surface of $CaRuO_3$ lower electrode thin-film, with pulsed laser deposition method, and by the use of $SrBi_3Ti_2TaO_{12}$(below also as SBTT) sintered body(This sintered body is expressed by formula: $Bi_2A_{m-1}B_mO_{3m+3}$ wherein symbol "m"=3, symbol "$A_2$"=$Sr_1$, $Bi_1$ and symbol "$B_3$"=$Ti_2$, $Ta_1$) as source material, about 200 nm film thickness of SBTT thin-film(dielectric thin-film) was formed.

When crystal structure of SBTT thin-film was measured by X-ray diffraction(XRD), it was confirmed that this crystal structure was [001] oriented, that is, its c-axis orientation was vertical to the surface of $SrTiO_3$ single crystal substrate. Further, surface roughness(Ra) of this SBTT thin-film was measured by AFM(atomic force microscope, SPI3800; Seiko instruments made) based upon JIS-B0601.

Next, on the surface of SBTT thin-film, 0.1 mm φ Pt upper electrode thin-film was formed by sputtering method and thin-film capacitor sample was manufactured.

Electric characteristics(dielectric constant, tan δ, the loss Q value, leak current and short ratio) and temperature characteristic of dielectric constant for the obtained capacitor sample were evaluated.

the same way as example 1, surface roughness(Ra) of SBTT thin-film and also electric characteristic and temperature characteristic of dielectric constant for the thin-film capacitor sample were evaluated. The result is shown in table 1.

TABLE 1

| | Substrate Surface Orientation | Film Orientation | Surface Roughness Ra (nm) | Leak Current (A/cm$^2$) | Short Ratio (%) | Dielectric Constant | Temperature Coefficient (ppm/° C.) | tan δ | The Loss Q Value |
|---|---|---|---|---|---|---|---|---|---|
| Ex. 1 | [100] | [001] | 0.5 | $1 \times 10^{-8}$ | 5 | 250 | <±200 | <0.01 | >100 |
| Comp. Ex. 1 | [110] | [118] | 3 | $5 \times 10^{-7}$ | 40 | 350 | ±1000 | >0.01 | <100 |
| Comp. Ex. 2 | [111] | [104] | 15 | $5 \times 10^{-5}$ | 80 | 350 | ±1000 | >0.01 | <100 |

Dielectric constant(no unit) was calculated from electrostatic capacity, electrode dimension and interelectrode distance of capacitor sample. The electrostatic capacity was measured by using digital LCR meter(4274A, YHP made) at capacitor sample, at ambient temperature(25° C.) and 100 kHz(AC20 mV) metering frequency.

Tan δ was measured under the same condition as above electrostatic capacity was measured and the loss Q value was also calculated.

Leak current characteristic(Unit is A/cm$^2$) was measured at 50 kV/cm field intensity. Short ratio(Unit is %) was determined by measuring 20 upper electrodes and calculating the ratio of which short-circuit among them.

As temperature characteristic of dielectric constant, at the capacitor sample, measuring dielectric constant under the abovementioned condition, and when at reference temperature of 25° C., measuring average change rates(Δε) of dielectric constant to temperature within temperature range of −55° C. to +150° C. and calculating temperature coefficient(ppm/° C.). The result is shown in table 1.

COMPARATIVE EXAMPLE 1

Except for the use of SrTiO$_3$ single crystal substrate ((110)CaRuO$_3$//(110) SrTiO$_3$) which CaRuO$_3$ as lower electrode thin-film was epitaxial grown to [110] orientation, in the same way as example 1, about 200 nm film thickness of SBTT thin-film(dielectric thin-film) was formed on the surface of CaRuO$_3$ lower electrode thin-film. When crystal structure of this SBTT thin-film was measured by X-ray diffraction(XRD), it was confirmed that this crystal structure was [118] oriented, and its c-axis orientation was not vertical to the surface of SrTiO$_3$ single crystal substrate. Further, in the same way as example 1, surface roughness(Ra) of SBTT thin-film and also electric characteristic and temperature characteristic of dielectric constant for the thin-film capacitor sample were evaluated. The result is shown in table 1.

COMPARATIVE EXAMPLE 2

Except for the use of SrTiO$_3$ single crystal substrate ((111)CaRuO$_3$//(111)SrTiO$_3$) which CaRuO$_3$ as lower electrode thin-film was epitaxial grown to [111] orientation, in the same way as example 1, about 200 nm film thickness of SBTT thin-film(dielectric thin-film) was formed on the surface of CaRuO$_3$ lower electrode thin-film. When crystal structure of this SBTT thin-film was measured by X-ray diffraction(XRD), it was confirmed that this crystal structure was [104] oriented, and its c-axis orientation was not vertical to the surface of SrTiO$_3$ single crystal substrate. Further, in As shown in Table 1, it was confirmed that c-axis orientation film for bismuth layer-structured compound of example 1 is inferior in dielectric constant, but superior in leak characteristic. Accordingly, not only even thinner-film can be expected but higher capacitance for thin-film capacitor can be expected. Moreover, at example 1, it was confirmed that in comparison to the other orientation directions of comparative examples 1 and 2, its temperature characteristic was superior. Further, it was also confirmed that since Example 1 was superior in surface smoothness property in comparison to comparative examples 1 and 2, it can be preferable thin-film material for manufacturing multi-layer structure. Namely, according to example 1, validity of c-axis orientation film for bismuth layer-structured compound was confirmed.

EXAMPLE 2

Except for forming about 35 nm film thickness of SBTT thin-film(dielectric thin-film) on the surface of CaRuO$_3$ lower electrode thin-film, in the same way as example 1, surface roughness(Ra) of SBTT thin-film and also electric characteristic(dielectric constant, tan δ, the loss Q value, leak current and break-down voltage) and temperature characteristic of dielectric constant for the thin-film capacitor sample were evaluated. The result is shown in table 2. Further, the break-down voltage(Unit is kV/cm) was measured by increasing the voltage when measuring leak characteristic.

EXAMPLE 3

Except for forming about 50 nm film thickness of SBTT thin-film(dielectric thin-film) on the surface of CaRuO$_3$ lower electrode thin-film, in the same way as example 1, surface roughness(Ra) of SBTT thin-film and also electric characteristic and temperature characteristic of dielectric constant for the thin-film capacitor sample were evaluated. The result is shown in table 2.

EXAMPLE 4

Except for forming about 100 nm film thickness of SBTT thin-film(dielectric thin-film) on the surface of CaRuO$_3$ lower electrode thin-film, in the same way as example 1, surface roughness(Ra) of SBTT thin-film and also electric characteristic and temperature characteristic of dielectric constant for the thin-film capacitor sample were evaluated. The result is shown in table 2.

TABLE 2

|  | Film Thickness (nm) | Surface Roughness Ra (nm) | Leak Current (A/cm$^2$) | Break-down Voltage (kV/cm) | Dielectric Constant | Temperature Coefficient(ppm/° C.) | tan δ | The Loss Q Value |
|---|---|---|---|---|---|---|---|---|
| Ex. 2 | 35 | 0.5 | $4 \times 10^{-7}$ | >1000 | 250 | <±200 | <0.04 | >25 |
| Ex. 3 | 50 | 0.5 | $1 \times 10^{-7}$ | >1000 | 250 | <±200 | <0.02 | >50 |
| Ex. 4 | 100 | 0.5 | $3 \times 10^{-8}$ | >1000 | 250 | <±200 | <0.01 | >100 |

As shown in Table 2, when film thickness for c-axis orientation film was made thinner, it was confirmed that although leak property became little inferior, surface roughness and dielectric constant did not change.

Further, Reference 1(Y. Sakashita, H. Segawa, K. Tominaga and M. Okada, J. Appl. Phys. 73,7857(1993)) shows the relation between film thickness of PZT(Zr/Ti=1) thin-film which is c-axis oriented and dielectric constant. Here, the result is shown that as the film thickness of PZT thin-film was made thinner to 500 nm, 200 nm and 80 nm, the dielectric constant(@1 kHz) decreased to 300, 250 and 100 respectively. Reference 2(Y. Takeshima, K. Tanaka and Y. Sakabe, Jpn. J. Appl. Phys. 39,5389(2000)) shows the relation between film thickness of BST(Ba:Sr=0.6:0.4) thin-film which is a-axis oriented and dielectric constant. Here, the result is shown that as the film thickness of BST thin-film was made thinner to 150 nm, 100 nm and 50 nm, the dielectric constant decreased to 1200, 850 and 600 respectively. Reference 3(H. J. Cho and H. J. Kim, Appl. Phys. Lett. 72,786(1998)) shows the relation between film thickness of BST(Ba:Sr=0.35:0.65) thin-film which is a-axis oriented and dielectric constant. Here, the result is shown that as the film thickness of BST thin-film was made thinner to 80 nm, 55 nm and 35 nm, the dielectric constant(@10 kHz) decreased to 330, 220 and 180 respectively.

Moreover, it was confirmed that even with 35 nm film thickness of example 2, 1000 kV/cm or more break-down voltage could be obtained. Accordingly, materials of the present invention can be considered as preferable for thin-film capacitor.

Further, since surface smoothness property was superior, they can be preferable thin-film material for manufacturing multilayer structure.

EXAMPLE 5

In the same way as example 1, Curie point of SBTT thin-film and electric characteristics(dielectric constant, tan δ and the loss Q value) of thin-film capacitor sample were evaluated except for the followings. As source material for pulsed laser deposition method, $Sr_xBi_{4-x}Ti_{3-x}Ta_xO_{12}$ (SBTT) sintered body(This sintered body is expressed by formula: $Bi_2A_{m-1}B_mO_{3m+3}$ wherein symbol "m"=3, symbol "$A_2$"=$Sr_x$, $Bi_{2-x}$ and symbol "$B_3$"=$Ti_{3-x}$, $Ta_x$. Here, "x" is changed to 0.4, 0.6, 0.8, 1.0 and 1.2.) was used and about 50 nm film thickness of SBTT thin-film(dielectric thin-film) was formed. The results are shown in Table 3.

Further, Curie point(Unit is ° C.) of dielectric thin-film is obtained by temperature change of dielectric constant.

TABLE 3

|  | Composition (x =) | Curie Point (° C.) | Dielectric Constant | tan δ | The Loss Q Value |
|---|---|---|---|---|---|
| Ex. 5 | 0.4 | 500 | 150 | <0.02 | >50 |
| Ex. 5 | 0.6 | 350 | 170 | <0.025 | >40 |
| Ex. 5 | 0.8 | 200 | 200 | <0.05 | >20 |

TABLE 3-continued

|  | Composition (x =) | Curie Point (° C.) | Dielectric Constant | tan δ | The Loss Q Value |
|---|---|---|---|---|---|
| Ex. 5 | 1.0 | 50 | 250 | <0.02 | >50 |
| Ex. 5 | 1.2 | <−55 | 220 | <0.01 | >100 |

As shown in Table 3, when composition "x" for c-axis orientation film of SBTT increased, Curie point decreased and dielectric constant at ambient temperature(25° C.) increased. When composition "x" was about 1, Curie point was around ambient temperature, and dielectric constant at ambient temperature was at maximum. Accordingly, when composition "x" was about 1 or more, it became paraelectric phase at ambient temperature that the loss Q value increased. Namely, it was confirmed that, when high capacitance was required, composition range of 1.0<x<1.2 was suitable.

EXAMPLE 6

In the same way as example 1, Curie point of LBT thin-film and electric characteristics(dielectric constant, tan δ and the loss Q value) of thin-film capacitor sample were evaluated except for the followings. As source material for pulsed laser deposition method, rare-earth element of La added $La_xBi_{4-x}Ti_3O_{12}$(LBT) sintered body(This sintered body is expressed by formula: $Bi_2A_{m-1}B_mO_{3m+3}$ wherein symbol "m"=3, symbol "$A_2$"=$Bi_{2-x}$, $La_x$ and symbol "$B_3$"=$Ti_3$. Here, "x" is changed to 0, 0.4, 0.6, 0.8, 1.0, 1.2 and 1.4.) was used and about 50 nm film thickness of LBT thin-film(dielectric thin-film) was formed. The results are shown in Table 4.

TABLE 4

|  | Composition (x =) | Curie Point (° C.) | Dielectric Constant | tan δ | The Loss Q Value |
|---|---|---|---|---|---|
| Ex. 6 | 0 | 700 | 140 | <0.02 | >50 |
| Ex. 6 | 0.4 | 500 | 150 | <0.02 | >50 |
| Ex. 6 | 0.6 | 400 | 160 | <0.02 | >50 |
| Ex. 6 | 0.8 | 300 | 180 | <0.025 | >40 |
| Ex. 6 | 1.0 | 150 | 200 | <0.05 | >20 |
| Ex. 6 | 1.2 | 0 | 240 | <0.01 | >100 |
| Ex. 6 | 1.4 | <−55 | 210 | <0.005 | >200 |

As shown in Table 4, when composition "x" for c-axis orientation film of LBT increased, Curie point decreased and dielectric constant at ambient temperature(25° C.) increased. When composition x was about 1.2, Curie point was around ambient temperature, and dielectric constant at ambient temperature was at maximum. Accordingly, when composition x was about 1.2 or more, it became paraelectric phase at ambient temperature that the loss Q value increased. Namely, it was confirmed that, for needs of high capacitance, composition range of 1.0<x<1.4 was suitable.

EXAMPLE 7

First, SrTiO$_3$ single crystal substrate(thickness of 0.3 mm) 4a(See FIG. 2, the same for following), which was [100] oriented, was prepared. And on the substrate 4a, by masking with metal mask of given pattern, with pulsed laser deposition method, 100 nm film thickness of CaRuO$_3$ made electrode thin-film as internal electrode thin-film 24 was formed(pattern 1).

Second, with pulsed laser deposition method, on the whole surface of substrate 4a including internal electrode thin-film 24, SBTT thin-film as dielectric thin-film 8a was formed in the same way as example 1, except film thickness was 100 nm. When crystal structure of this SBTT thin-film was measured by X-ray diffraction(XRD), it was confirmed that this crystal structure was [001] oriented, that is, oriented to c-axis. Surface roughness(Ra) of the SBTT thin-film was, by measuring in the same way as example 1, 0.5 nm that was superior in surface smoothness property.

Third, on the SBTT thin-film, by masking with metal mask of given pattern, with pulsed laser deposition method, 100 nm film thickness of CaRuO$_3$ made electrode thin-film as internal electrode thin-film 26 was formed(pattern 2).

Forth, with pulsed laser deposition method, on the whole surface of substrate 4a including internal electrode thin-film 26, SBTT thin-film as dielectric thin-film 8a was formed again in the same way as example 1, except film thickness was 100 nm.

By repeating these processes, 20 layers of SBTT thin-film were laminated. And the surface of dielectric thin-film 8a arranged at the most external part was covered with protection film 30 which is composed of silica to obtain capacitor body 22.

Next, at both ends of the capacitor body 22, a pair of external electrodes 28 and 29 composed of Ag is formed to obtain rectangular parallelepiped configuration of thin-film multilayer capacitor sample having length of 1 mm×width of 0.5 mm×thickness of 0.4 mm.

Electric characteristic(dielectric constant, dielectric loss, Q value, leak current and short ratio) of obtained capacitor sample were evaluated in the same way as example 1. The results were 250 dielectric constant, 0.01 tan δ, 100 loss Q value and 1×10$^{-7}$ A/cm$^2$ leak current and were satisfactory. Further, temperature characteristic of dielectric constant for capacitor sample was evaluated in the same way as example 1 and its temperature coefficient was 190 ppm/° C.

EXAMPLE 8

In the same way as example 6, capacitor sample was manufactured and electric characteristics(leak current and short ratio) of the capacitor sample were evaluated. The results are shown in Table 5.

TABLE 5

| | Composition (x =) | Leak Current (A/cm$^2$) | Short Ratio (%) |
|---|---|---|---|
| Ex. 7 | 0 | 1 × 10$^{-7}$ | 10 |
| Ex. 7 | 0.4 | 5 × 10$^{-8}$ | 5 |
| Ex. 7 | 0.6 | 4 × 10$^{-8}$ | 5 |

TABLE 5-continued

| | Composition (x =) | Leak Current (A/cm$^2$) | Short Ratio (%) |
|---|---|---|---|
| Ex. 7 | 0.8 | 4 × 10$^{-8}$ | 5 |
| Ex. 7 | 1.0 | 5 × 10$^{-8}$ | 5 |
| Ex. 7 | 1.2 | 5 × 10$^{-8}$ | 5 |
| Ex. 7 | 1.4 | 5 × 10$^{-8}$ | 5 |

As shown in Table 5, when composition "x" for c-axis orientation film of LBT increased, leak current decreased and short ratio decreased. Namely, it was confirmed that, in order to improve leak characteristic, composition range of 0.4<x<1.4 was suitable.

EXAMPLE 9

In the present invention, thin-film capacitor sample manufactured at example 1, frequency characteristic and voltage characteristic were evaluated.

Figure 3:
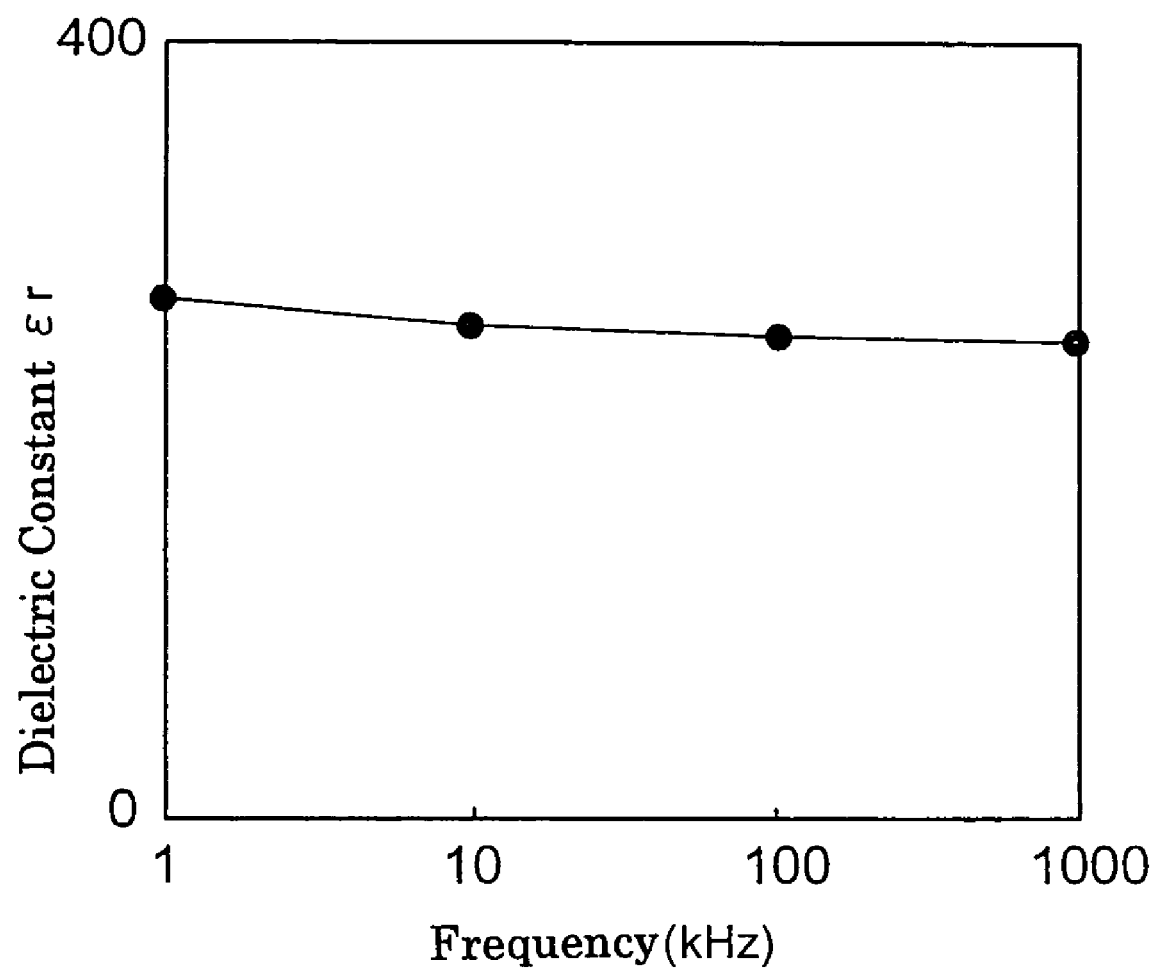
FIG. 3 is a graph of frequency characteristic for capacitor sample of example 9.

Frequency characteristic was evaluated as following. At the capacitor sample, by changing frequency from 1 kHz to 1 MHz at ambient temperature(25° C.), electrostatic capacity was measured and also dielectric constant was calculated. The results are shown in FIG. 3. For the measurement of electrostatic capacity, LCR meter was used. As shown in FIG. 3, even changing frequency to 1 MHz at specific temperature, it was confirmed that dielectric constant value does not change. Namely, it was confirmed that frequency characteristic is superior.

Figure 4:
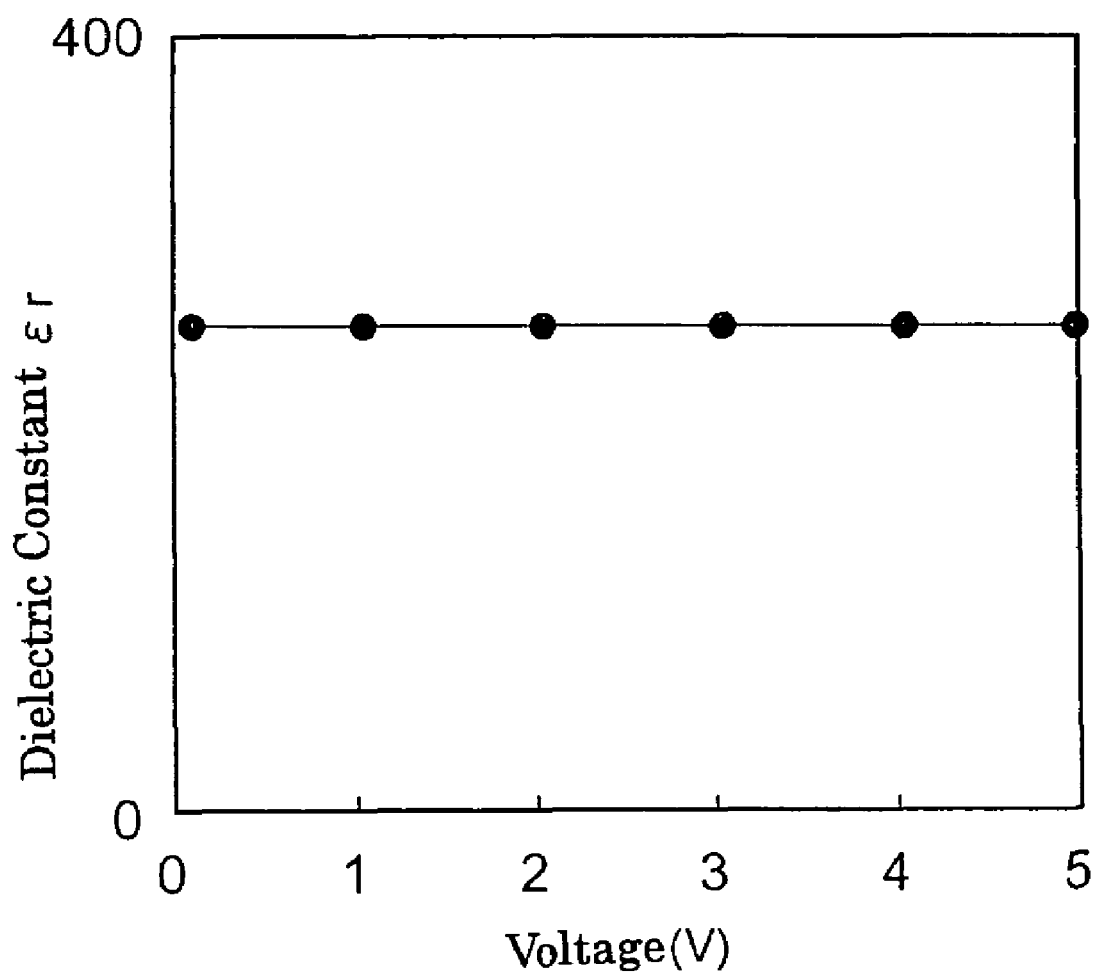
FIG. 4 is a graph of voltage characteristic for capacitor sample of example 9.

Voltage characteristic was evaluated as following. At the capacitor sample, by changing metering voltage(impressed voltage) at specific frequency(100 kHz) from 0.1V(50 kV/cm electrolytic strength) to 5V(250 kV/cm electrolytic strength), electrostatic capacity was measured(Metering temperature was 25° C.) at specific voltage and also dielectric constant was calculated. The results are shown in FIG. 4. For the measurement of electrostatic capacity, LCR meter was used. As shown in FIG. 4, even changing metering voltage to 5V at specific frequency, it was confirmed that dielectric constant value does not change. Namely, it was confirmed that voltage characteristic is superior.

EXAMPLE 10

Heating single crystal silicon (100) substrate at 600° C., on the substrate, by pulsed laser deposition method and using Bi$_4$Ti$_3$O$_{12}$(Below, also as BiT) sintered body(This sintered body is expressed by formula: Bi$_2$A$_{m-1}$B$_m$O$_{3m+3}$ wherein symbol "m"=3, symbol "A$_2$"=Bi$_2$ and symbol "B$_3$"=Ti$_3$.) as source material, about 50 nm film thickness of BiT thin-film(high dielectric constant insulating film) was formed.

When crystal structure of this BiT thin-film was measured, in the same way as example 1, by X-ray diffraction (XRD), it was confirmed that this crystal structure was [001] oriented, that is, its c-axis orientation was vertical to the surface of single crystal silicon substrate. Further, surface roughness(Ra) of this BiT thin-film was measured in the same way as example 1.

Further, electric characteristics(dielectric constant, tan δ, the loss Q value, leak current and short ratio) and temperature characteristic of dielectric constant for this high dielectric constant insulating film comprising this BiT thin-film were evaluated in the same way as example 1. The results are shown in Table 6.

TABLE 6

|  | Film Thickness (nm) | Surface Roughness Ra (nm) | Leak Current (A/cm$^2$) | Break-down Voltage (kV/cm) | Dielectric Constant | Temperature Coefficient(ppm/° C.) | tan δ | The Loss Q Value |
|---|---|---|---|---|---|---|---|---|
| Ex. 10 | 50 | 2 | $1 \times 10^{-7}$ | >500 | 100 | <±300 | <0.02 | >50 |
| Ex. 12 | 50 | 1 | $5 \times 10^{-8}$ | >1000 | 200 | <±200 | <0.01 | >100 |

EXAMPLE 11

In the same way as example 10, dielectric constant and leak current for high dielectric constant insulating film were obtained except for the followings. As source material for pulsed laser deposition method, rare-earth element of La added La$_x$Bi$_{4-x}$Ti$_3$O$_{12}$(LBT) sintered body(This sintered body is expressed by formula: Bi$_2$A$_{m-1}$B$_m$O$_{3m+3}$ wherein symbol "m"=3, symbol "A$_2$"=Bi$_{2-x}$, La$_x$ and symbol "B$_3$"=Ti$_3$. Here, "x" is changed to 0, 0.2, 0.4 and 0.6.) was used and about 50 nm film thickness of LBT thin-film(high dielectric constant insulating film) was formed. The results are shown in Table 7.

TABLE 7

|  | Composition (x =) | Dielectric Constant (RT) @ 100 kHz | Leak Current (A/cm$^2$) @ 1 V |
|---|---|---|---|
| Ex. 11 | 0 | 100 | $1 \times 10^{-7}$ |
| Ex. 11 | 0.2 | 105 | $5 \times 10^{-8}$ |
| Ex. 11 | 0.4 | 110 | $3 \times 10^{-8}$ |
| Ex. 11 | 0.6 | 120 | $3 \times 10^{-8}$ |

As shown in Table 7, it was confirmed that, as content of rare-earth elements at LBT thin-film(high dielectric constant insulating film) increased, dielectric constant increased and leak current decreased. Namely, it was confirmed that, high dielectric constant insulating film of the invention is suitable for a gate insulating film.

EXAMPLE 12

On the surface of lower electrode thin-film, by pulsed laser deposition method and using Ba$_2$Bi$_4$Ti$_5$O$_{18}$(Below, also as B$_2$BT) sintered body(This sintered body is expressed by formula: Bi$_2$A$_{m-1}$B$_m$O$_{3m+3}$ wherein symbol "m"=5, symbol "A$_4$"=Ba$_2$, Bi$_2$ and symbol "B$_5$"=Ti$_5$.) as source material, about 50 nm film thickness of B$_2$BT thin-film(high dielectric constant insulating film) was formed.

When crystal structure of this B$_2$BT thin-film was measured by X-ray diffraction(XRD), it was confirmed that this crystal structure was [001] oriented, that is, its c-axis orientation was vertical to the surface of SrTiO$_3$ single crystal substrate. Further, surface roughness(Ra) of this B$_2$BT thin-film was measured in the same way as example 1.

Further, electric characteristics(dielectric constant, tan δ, the loss Q value, leak current and short ratio) and temperature characteristic of dielectric constant for this high dielectric constant insulating film comprising this B$_2$BT thin-film were evaluated in the same way as example 1. The results are shown in Table 6.

Note that embodiments and examples of the present invention were explained above, however, the present invention is not limited to the above embodiments nor examples and may be modified in various ways within the scope of the invention.

What is claimed is:

1. A thin-film capacitance device composition including a bismuth layer-structured compound whose c-axis is oriented vertically to a substrate surface, wherein
said bismuth layer-structured compound is expressed by a formula: Bi$_2$A$_{m-1-x}$Re$_x$B$_m$O$_{3m+3}$, wherein symbol "m" is selected from odd numbers, symbol "x" is 0.4 to 1.8, symbol "A" is at least one element selected from Na, K, Pb, Ba, Sr, Ca and Bi, symbol "B" is at least one element selected from Fe, Co, Cr, Ga, Ti, Nb, Ta, Sb, V, Mo and W, and symbol "Re" is at least one rare-earth element selected from Sc, Y, La, Ce, Pr, Nd, Pm, Sm, Eu, Gd, Tb, Dy, Ho, Er, Tm, Yb and Lu.

2. The thin-film capacitance device composition as in claim 1, characterized in degree of c-axis orientation for said bismuth layer-structured compound is 80% or more.

3. The thin-film capacitance device composition as in claim 1, wherein Curie temperature is −100° C. or more to 100° C. or less.

4. The thin-film capacitance device composition as in claim 1, wherein "m" in the formula composing said bismuth layer-structured compound is anyone of 1,3,5 and 7.

5. The thin-film capacitance device composition as in claim 1, wherein said "x" in formula composing said bismuth layer-structred compound is 1.0 to 1.4.

6. A thin-film capacitance device comprising lower electrode, dielectric thin-film and upper electrode formed one by one on a substrate, wherein said dielectric thin-film is composed of thin-film capacitance device composition,
the thin-film capacitance device composition include a bismuth layer-structured compound whose c-axis is oriented vertically to the substrate surface, and
the bismuth layer-structured compound is expressed by a formula: Bi$_2$A$_{m-1-x}$Re$_x$B$_m$O$_{3m+3}$, wherein symbol "m" is selected from odd numbers, symbol "x" is 0.4 to 1.8, symbol "A" is at least one element selected from Na, K, Pb, Ba, Sr, Ca and Bi, symbol "B" is at least one element selected from Fe, Co, Cr, Ga, Ti, Nb, Ta, Sb, V, Mo and W, and symbol "Re" is at least one rare-earth element selected from Sc, Y, La, Ce, Pr, Nd, Pm, Sm, Eu, Gd, Tb, Dy, Ho, Er, Tm, Yb and Lu.

7. The thin-film capacitance device as in claim 6, characterized in degree of c-axis orientation for said bismuth layer-structured compound is 80% or more.

8. The thin-film capacitance device as in claim 6, wherein said thin-film capacitance device composition has Curie temperature of −100° C. or more to 100° C. or less.

9. The thin-film capacitance device as in claim 6, wherein said substrate is composed of amorphous material.

10. The thin-film capacitance device as in claim 6, wherein thickness of said dielectric thin-film is 5 to 1000 nm.

11. The thin-film capacitance device as in claim 6, wherein "m" in the formula composing said bismuth layer-structured compound is any one of 1, 3, 5 and 7.

12. The thin-film capacitance device as in claim 6, wherein said lower electrode is formed by epitaxial growth on said substrate to [100] orientation.

13. The thin-film capacitance device composition as in claim 6, wherein said "x" in the formula composing said bismuth layer-structured compound is 1.0 to 1.4.

14. A thin-film multilayer capacitor comprising multiple dielectric thin-films and internal electrode thin-films alternately layered on a substrate, wherein
said dielectric thin-films are composed of thin-film capacitance device compositions,
the thin-film capacitance device compositions include a bismuth layer-structured compound whose c-axis is oriented vertically to the substrate surface, and
said bismuth layer-structured compound is expressed by a formula: $Bi_2A_{m-1-x}Re_xB_mO_{3m+3}$, wherein symbol "m" is selected from odd numbers, symbol "x" is 0.4 to 1.8, symbol "A" is at least one element selected from Na, K, Pb, Ba, Sr, Ca and Bi, symbol "B" is at least one element selected from Fe, Co, Cr, Ga, Ti, Nb, Ta, Sb, V, Mo and W, and symbol "Re" is at least one rare-earth element selected from Sc, Y, La, Ce, Pr, Nd, Pm, Sm, Eu, Gd, Tb, Dy, Ho, Er, Tm, Yb and Lu.

15. The thin-film multilayer capacitor as in claim 14, characterized in degree of c-axis orientation for said bismuth layer-structured compound is 80% or more.

16. The thin-film multilayer capacitor as in claim 14, wherein said thin-film capacitance device composition has Curie temperature of −100° C. or more to 100° C. or less.

17. The thin-film multilayer capacitor as in claim 14, characterized in said internal electrode thin-film is composed of noble metal, base metal or conductive oxide.

18. The thin-film multilayer capacitor as in claim 14, wherein said substrate is composed of amorphous material.

19. The thin-film multilayer capacitor as in claim 14, wherein thickness of said dielectric thin-film is 5 to 1000 nm.

20. The thin-film multilayer capacitor as in claim 14, wherein "m" in the formula composing said bismuth layer-structured compound is any one of 1, 3, 5 and 7.

21. The thin-film multilayer capacitor as in claim 14, wherein said internal electrode thin-film is formed to [100] orientation.

22. The thin-film multilayer capacitor as in claim 14, wherein said "x" in the formula composing said bismuth layer-structured compound is 1.0 to 1.4.

23. A dielectric thin-film composition for capacitor including a bismuth layer-structured compound whose c-axis is oriented vertically to a substrate surface, wherein
said bismuth layer-structured compound is expressed by a formula: $Bi_2A_{m-1-x}Re_xB_mO_{3m+3}$, wherein symbol "m" is selected from odd numbers, symbol "x" is 0.4 to 1.8, symbol "A" is at least one element selected from Na, K, Pb, Ba, Sr, Ca and Bi, symbol "B" is at least one element selected from Fe, Co, Cr, Ga, Ti, Nb, Ta, Sb, V, Mo and W, and symbol "Re" is at least one rare-earth element selected from Sc, Y, La, Ce, Pr, Nd, Pm, Sm, Eu, Gd, Tb, Dy, Ho, Er, Tm, Yb and Lu.

24. The dielectric thin-film composition for capacitor as in claim 23, characterized in degree of c-axis orientation for said bismuth layer-structured compound is 80% or more.

25. The dielectric thin-film composition for capacitor as in claim 23, wherein said "x" in the formula composing said bismuth layer-structured compound is 1.0 to 1.4.

26. The dielectric thin-film composition for capacitor as in claim 23, wherein Curie temperature is −100° C. or more to 100° C. or less.

27. A thin-film capacitor comprising lower electrode, dielectric thin-film and upper electrode formed one by one on a substrate, wherein
said dielectric thin-film is composed of dielectric thin-film composition,
the dielectric thin-film composition include a bismuth layer-structured compound whose c-axis is oriented vertically to the substrate surface, and
the bismuth layer-structured compound is expressed by a formula: $Bi_2A_{m-1-x}Re_xB_mO_{3m+3}$, wherein symbol "m" is selected from odd numbers, symbol "x" is 0.4 to 1.8, symbol "A" is at least one element selected from Na, K, Pb, Ba, Sr, Ca and Bi, symbol "B" is at least one element selected from Fe, Co, Cr, Ga, Ti, Nb, Ta, Sb, V, Mo and W, and symbol "Re" is at least one rare-earth element selected from Sc, Y, La, Ce, Pr, Nd, Pm, Sm, Eu, Gd, Tb, Dy, Ho, Er, Tm, Yb and Lu.

28. The thin-film capacitor as in claim 27, characterized in degree of c-axis orientation for said bismuth layer-structured compound is 80% or more.

29. The thin-film capacitor as in claim 27, wherein said dielectric thin-film composition has Curie temperature of −100° C. or more to 100° C. or less.

30. The thin-film capacitor as in claim 27, wherein said "x" in the formula composing said bismuth layer-structured compound is 1.0 to 1.4.

31. A high-dielectric constant insulating film including a bismuth layer-structured compound whose c-axis is oriented vertically to a substrate surface, wherein,
said bismuth layer-structured compound is expressed by a formula: $Bi_2A_{m-1-x}Re_xB_mO_{3m+3}$, wherein symbol "m" is selected from odd numbers, symbol "x" is 0.4 to 1.8, symbol "A" is at least one element selected from Na, K, Pb, Ba, Sr, Ca and Bi, symbol "B" is at least one element selected from Fe, Co, Cr, Ga, Ti, Nb, Ta, Sb, V, Mo and W, and symbol "Re" is at least one rare-earth element selected from Sc, Y, La, Ce, Pr, Nd, Pm, Sm, Eu, Gd, Tb, Dy, Ho, Er, Tm, Yb and Lu.

32. The high-dielectric constant insulating film as in claim 31, characterized in degree of c-axis orientation for said bismuth layer-structured compound is 80% or more.

33. The thin-film capacitor as in claim 31, wherein said "x" in the formula composing said bismuth layer-structured compound is 1.0 to 1.4.

* * * * *